(12) United States Patent
Ma et al.

(10) Patent No.: US 7,300,864 B2
(45) Date of Patent: Nov. 27, 2007

(54) METHOD FOR FORMING SOLDER BUMP STRUCTURE

(75) Inventors: Keum-Hee Ma, Andong-si (KR); Se-Young Jeong, Seoul (KR); Dong-Hyeon Jang, Suwon-si (KR); Gu-Sung Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 80 days.

(21) Appl. No.: 10/911,672

(22) Filed: Aug. 5, 2004

(65) Prior Publication Data

US 2005/0090089 A1   Apr. 28, 2005

(30) Foreign Application Priority Data

Oct. 22, 2003   (KR) .................. 10-2003-0073864

(51) Int. Cl.
*H01L 21/44* (2006.01)
(52) U.S. Cl. .................................. 438/612
(58) Field of Classification Search ........ 257/734–740; 438/106–118, 612; 277/779, E21.507
See application file for complete search history.

(56) References Cited

U.S. PATENT DOCUMENTS

| | | | |
|---|---|---|---|
| 6,146,984 A | 11/2000 | Leibovitz et al. | |
| 6,281,106 B1 * | 8/2001 | Higdon et al. | 438/613 |
| 6,387,793 B1 | 5/2002 | Yap et al. | |
| 6,486,054 B1 * | 11/2002 | Fan et al. | 438/613 |
| 6,841,872 B1 * | 1/2005 | Ha et al. | 257/736 |
| 6,959,856 B2 * | 11/2005 | Oh et al. | 228/245 |
| 2003/0129823 A1 | 7/2003 | Amador et al. | |
| 2003/0167632 A1 * | 9/2003 | Thomas et al. | 29/841 |
| 2004/0197979 A1 * | 10/2004 | Jeong et al. | 438/202 |
| 2005/0127508 A1 * | 6/2005 | Lee et al. | 257/737 |
| 2005/0208751 A1 * | 9/2005 | Oh et al. | 438/614 |
| 2006/0115932 A1 * | 6/2006 | Farnworth et al. | 438/125 |

FOREIGN PATENT DOCUMENTS

JP    57-4127    1/1982

(Continued)

OTHER PUBLICATIONS

S. Wolf and R.N. Tauber, Silicon Processing, 1986, Lattice Press, vol. 1, pp. 407-408.*
Korean Office Action dated Jun. 30, 2005.

*Primary Examiner*—Nathan W. Ha
(74) *Attorney, Agent, or Firm*—Harness, Dickey & Pierce, P.L.C.

(57) ABSTRACT

A solder bump structure may be formed using a dual exposure technique of a photoresist, which may be a positive photoresist. The positive photoresist may be coated on an IC chip. First openings may be formed at first exposed regions of the photoresist by a first exposure process. Metal projections may be formed in the first openings. A second opening may be formed at a second exposed region of the photoresist by a second exposure process. The second exposed region may include non-exposed regions defined by the first exposure process. A solder material may fill the second opening and may be reflowed to form a solder bump. The metal projections may be embedded within the solder bump.

20 Claims, 13 Drawing Sheets

FOREIGN PATENT DOCUMENTS

| | | |
|---|---|---|
| JP | 05-166814 | 7/1993 |
| JP | 2000-91371 | 3/2000 |
| JP | 2000-243777 | 9/2000 |
| KR | 1996-0016007 | 9/1994 |
| KR | 1996-019623 | 6/1996 |
| KR | 1019960039234 | 11/1996 |
| KR | 2002-0006468 | 1/2002 |
| KR | 2002-0071096 | 9/2002 |

* cited by examiner

METHOD FOR FORMING SOLDER BUMP STRUCTURE

CROSS REFERENCE TO RELATED APPLICATIONS

This U.S. non-provisional application claims priority under 35 U.S.C. § 119 to Korean Patent Application No. 2003-73864 filed Oct. 22, 2003, the disclosure of which is incorporated herein in its entirety by reference.

BACKGROUND OF THE INVENTION

1. Field of the Invention

The present invention relates generally to electronic packaging technology and, more particularly, to solder bump structures that may be used for flip chip packages or wafer level packages, for example.

2. Description of the Related Art

As integrated circuits (IC) advance toward higher speeds and larger pin counts, first-level interconnection techniques employing wire bonding technologies may have approached or even reached their limits. For example, technologies for achieving fine-pitch wire bonding structures may not keep pace with the demand resulting from increased IC chip processing speeds and higher IC chip pin counts. As such, a current trend may involve replacing wire bonding structures with other package structures, such as flip chip packages or wafer level packages (for example).

Flip chip packages and wafer level packages may employ solder bumps, which connect to interconnection terminals of the IC chips. A conventional solder bump structure is shown in FIGS. 1A and 1B, where like elements are designated by the same reference numbers. FIG. 1A shows the solder bump structure prior to being mounted on a circuit substrate, and FIG. 1B shows the solder bump structure after being mounted on the circuit substrate.

Referring to FIGS. 1A and 1B, an IC chip 1 may be equipped with a plurality of chip pads 2. Only one chip pad 2 is shown in FIGS. 1A and 1B. The chip pad 2 may be typically formed of aluminum (Al). Openings may be defined in one or more passivation layers 3 and 4 to expose surfaces of the chip pads 2. One or more under bump metal (UBM) layers 6 and 7 may be interposed between a solder bump 5 and the chip pad 2.

The UBM layers 6 and 7 may function to reliably secure the solder bump 5 to the chip pad 2, and to prevent moisture absorption into the chip pad 2 and the IC chip 1. Typically, the first UBM layer 6 may function as an adhesion layer and may be deposited by sputtering of Cr, Ti, or TiW. Also typically, the second UBM layer 7 may function as a solder wetting layer and may be deposited by sputtering of Cu, Ni, or NiV. The UBM layer 6 or 7, or an intermediate layer therebetween, may function as a solder diffusion barrier. Further, another layer may be optionally deposited on the UBM layers 6 or 7 or the intermediate layer for oxidation prevention purposes.

As shown in FIG. 1B, the flip chip package or the wafer level package may be mounted on a circuit substrate 9 via the solder bumps 5. The circuit substrate 9 may have a plurality of substrate pads 8 corresponding to the chip pads 2 of the IC chip 1. The respective solder bumps 5 may provide solder joints between both pads 2 and 8.

The solder bumps 5 may be subjected to thermal and/or mechanical stresses due to a difference in the coefficient of thermal expansion (CTE) between the IC chip 1 and the circuit substrate 9. Thermal and/or mechanical stresses on the solder bump 5 may cause a crack or fissure, which may propagate completely through the solder bump structure.

An attempt to solve the above-discussed problem has been disclosed in Japanese Patent Publication No. 2000-91371. According to this disclosure, a pillar-shaped metal bump may be embedded within a solder bump to absorb stresses applied to the solder bump. However, a solder layer for the solder bump may be formed on the pillar-shaped metal bump filled in an aperture part of a photoresist film. Thus, the solder layer may be shaped into a mushroom over the photoresist film so that the finished solder bump meets the desired size requirements. Due to the mushroom-shaped solder layer, this conventional, solder bump forming technique may not be suitable for preparing a fine-pitch configuration. For example, the mushroom-shaped solder layer may inadvertently overlap with an adjacent solder layer.

Applicant has introduced a solder bump structure having metal projections, which may reduce cracks and also facilitate the preparation of a fine-pitch configuration. An example of this solder bump structure is depicted in FIGS. 2A and 2B.

Referring to FIGS. 2A and 2B, the solder bump structure may include a plurality of metal projections 511 extending upwardly from a surface of a UBM layer 507. The metal projections 511 may be embedded within a solder bump 505. The metal projections 511 may be arranged in a regular mesh pattern as shown in FIG. 2B. The regular mesh pattern of the projections 511 may act as obstacles to crack propagation, and further lengthens the propagation path of any crack as it travels through the solder bump 505, thus decreasing the likelihood of device failure.

FIGS. 3A though 3I show an exemplary method for manufacturing the solder bump structure shown in FIGS. 2A and 2B. As shown in FIG. 3A, the UBM layers 506 and 507 may be formed over chip pads 502 and passivation layers 503 and 504 on an IC chip 501. As shown in FIG. 3B, a photoresist 515 may be coated over the UBM layer 507, and as shown in FIG. 3C, the photoresist 515 may be patterned through exposure and development processes so as to form a plurality of openings 516 selectively exposing the UBM layer 507. As shown in FIG. 3D, a metal 511 may be deposited in the openings 516, and as shown in FIG. 3E, the photoresist 515 may be removed, with the resultant structure having the metal projections 511.

As shown in FIG. 3F, another photoresist 517 may be coated over the structure having the projections 511. As shown in FIG. 3G, the photoresist 517 may be patterned through exposure and development processes so as to form a single opening 518 exposing the metal projections 511, and as shown in FIG. 3H, a solder material 505 may deposited in the opening 518. As shown in FIG. 3I, the photoresist 517 may be removed and the UBM layers 506 and 507 may be etched using the solder material 505 as a mask. The solder material 505 may be reflowed into a globe-shape configuration.

In the solder bump forming technique depicted in FIGS. 3A through 3I, separate openings 516 (see FIG. 3C) and 518 (see FIG. 3G) may be respectively used to form the metal projections 511 and the solder bump 505. This technique makes it possible to deposit the solder material just within the opening 518, thereby avoiding the formation of the mushroom-shaped solder layer associated with the technique disclosed in Japanese Patent Publication No. 2000-91371. Thus, the forming technique depicted in FIGS. 3A through 3I may be used to prepare a fine-pitch configuration.

SUMMARY OF THE INVENTION

Exemplary embodiments of the present invention may provide a simple method for forming a solder bump structure.

According to an exemplary embodiment of the present invention, a method for forming a solder bump structure may involve forming a first opening in a photoresist by performing a first exposure process and a first development process. A metal layer may be formed in the first opening. A second opening may be form in the photoresist by performing a second exposure process and a second development process. A solder layer may be formed in the second opening. The photoresist may be a positive photoresist.

The first opening may be formed at an exposed region of the photoresist, the exposed region being defined by the first exposure process. Further, the second opening may be formed at an exposed region of the positive photoresist, the exposed region being defined by the second exposure process, and the exposed region including a non-exposed region defined by the first exposure process. The second opening may be larger than the first opening.

According to another exemplary embodiment of the present invention, a method for forming a solder bump structure may involve forming at least one UBM layer on an active surface of an IC chip. A photoresist may be applied to the UBM layer. A plurality of first openings may be formed in the photoresist by perfoming a first exposure process and a first development process. The UBM layer may be selectively exposed through the first openings. A plurality of metal projections may be formed in the plurality of first openings. The metal projections may extend from the UBM layer. A second opening may be formed in the photoresist by performing a second exposure process and a second development process. The metal projections may be exposed through the second opening. A solder layer may be formed in the second opening so that the metal projections may be embedded within the solder layer. The photoresist layer may be remove, and the solder layer may be reflowed to form a globe-shaped solder bump.

The photoresist may be a positive type photoresist. The plurality of first openings may be respectively formed at first exposed regions of the positive photoresist, the first exposed regions being defined by the first exposure process. The second opening may be formed at a second exposed region of the positive photoresist, the second exposed region being defined by the second exposure process, and the second exposed region including non-exposed regions defined by the first exposure process. The plurality of metal projections may have a pattern, in cross-section, including a regular mesh pattern, an irregular mesh pattern, offset parallel row patterns, and concentric sets of patterns. The metal projections may be fabricated from at least one of Ni, Cu, Pd, Pt, and alloys thereof. The solder layer may be fabricated from at least one of Sn, Pb, Ni, Au, Ag, Cu, Bi, alloys thereof. The UBM layer may include a lower UBM layer acting as an adhesion layer and an upper UBM layer acting as a solder wetting layer.

DETAILED DESCRIPTION OF EXEMPLARY EMBODIMENTS OF THE INVENTION

Exemplary, non-limiting embodiments of the present invention will now be described more fully hereinafter with reference to the accompanying drawings. This invention may, however, be embodied in many different forms and should not be construed as limited to the exemplary embodiment set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

It is to be appreciated that the figures are not drawn to scale. Rather, for simplicity and clarity of illustration, the dimensions of some of the elements are exaggerated relative to other elements. Like numerals are used for like and corresponding parts of the various drawings.

FIGS. 4A through 4G show, in cross-sectional views, a method for forming a solder bump structure 100 in accordance with an exemplary embodiment of the present invention.

Figure 4A:
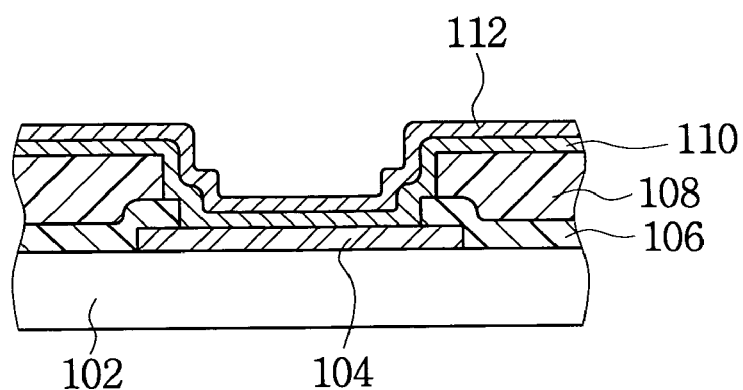
FIGS. 4A through 4G are cross-sectional views showing a method for forming a solder bump structure in accordance with an exemplary, non-limiting embodiment of the present invention.

Referring to FIG. 4A, an integrated circuit (IC) chip 102 may have a plurality of chip pads 104 and passivation layers 106 and 108. The IC chip 102 may be a single chip separated from a wafer, for a flip chip package, or any chip included in the wafer, for a wafer level package. The chip pads 104 and the passivation layers 106 and 108 may be provided on an active surface (i.e., the upward facing surface in FIG. 4A) of the IC chip 102 through wafer fabrication processes that are well known in this art. The chip pads 104, may be fabricated from aluminum (Al) and/or other suitable materials, as is well known in this art. The chip pads 104 may be used as input/output (I/O) terminals of the IC chip 102. The passivation layers 106 and 108 may protect internal circuits within the IC chip 102. The chip pads 104 may be exposed through openings in the passivation layers 106 and 108. The lower passivation layer 106 may be fabricate from silicon oxide, silicon nitride, and/or other suitable materials, as is well known in this art. The upper passivation layer 108 may be fabricated from polyimide and/or other suitable materials, as is well known in this art. Although only two passivation layers 106 and 108 are illustrated, the invention is not so limited and may include more or less than two passivation layers.

Under bump metal (UBM) layers 110 and 112 may be provided on the chip pads 104 and the passivation layers 106 and 108. A lower UBM layer 110 may act as an adhesion layer and may be deposited by sputtering of Cr, Ti, TiW, and/or other suitable materials, as is well known in this art.

An upper UBM layer 112 may act as a solder wetting layer and may be deposited by sputtering of Cu, Ni, NiV, and/or other suitable materials, as is well known in this art. The UBM layer 110 or 112, or an intermediate layer provided therebetween, may function as a solder diffusion barrier. Further, another UBM layer may be optionally provided on the UBM layers 110 or 112 or the intermediate layer for oxidation prevention purposes. It will be appreciated that the UBM layers may be formed via sputtering, as well as other deposition processes.

Figure 4B:
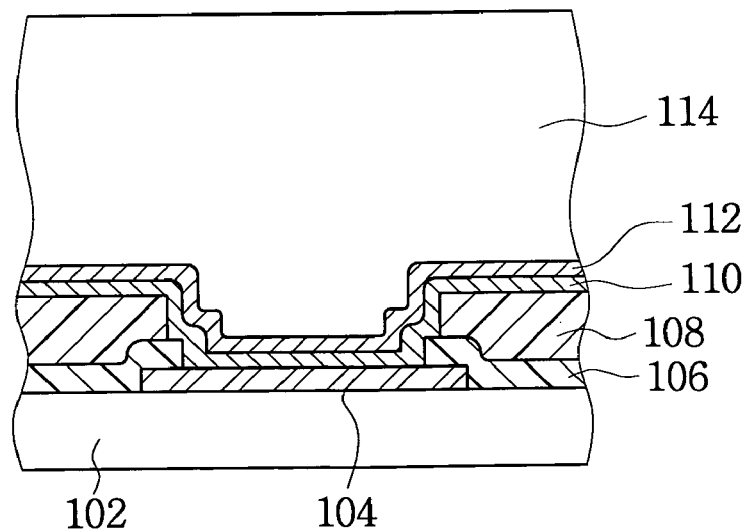

As shown in FIG. 4B, a photoresist 114 may be coated on the upper UBM layer 112. In the exemplary embodiment, the photoresist 114 may be of a positive type and may be coated to a thickness that is greater than a thickness typically coated in conventional manufacture techniques.

Figure 1A:
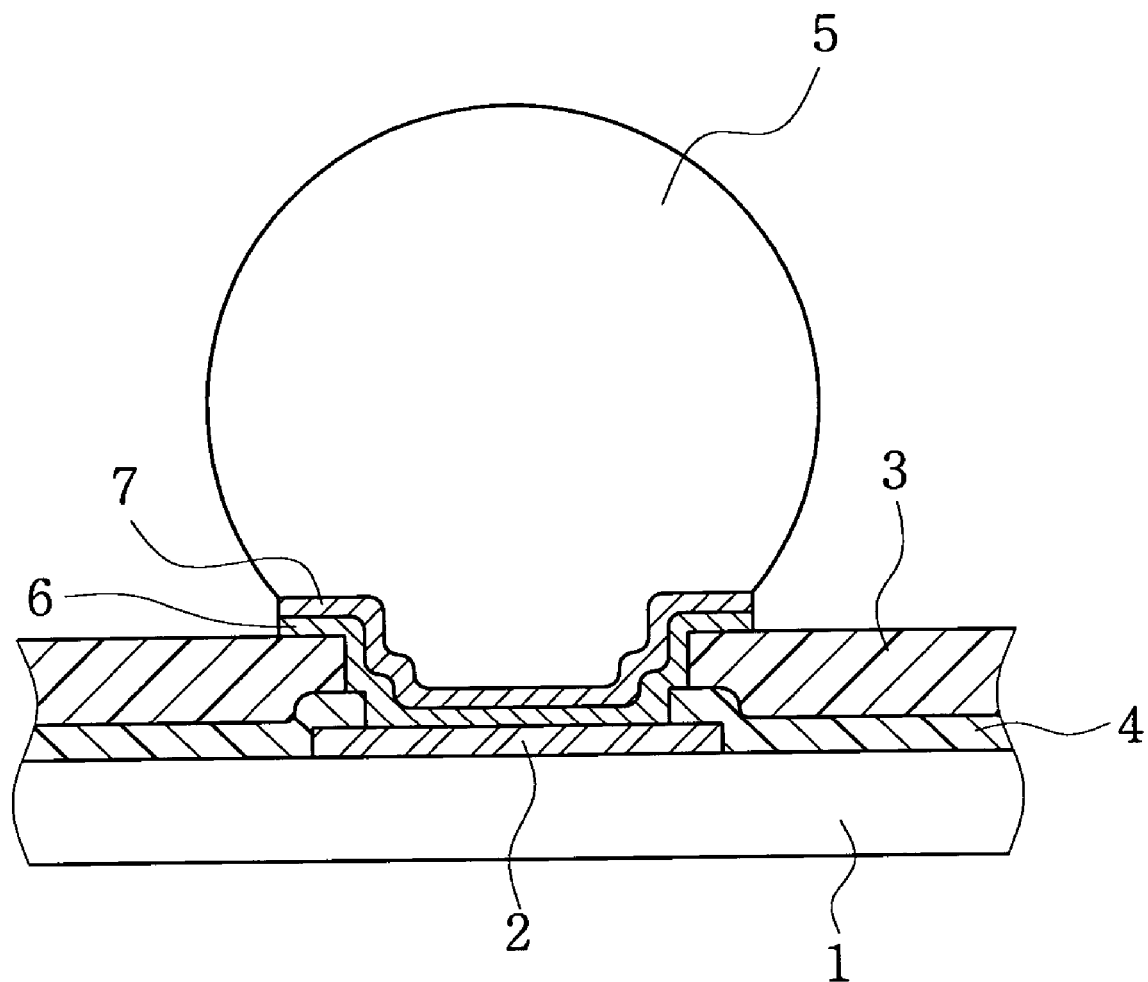
FIG. 1A is a cross-sectional view showing a prior art solder bump structure before being mounted on a circuit substrate.
Figure 1B:
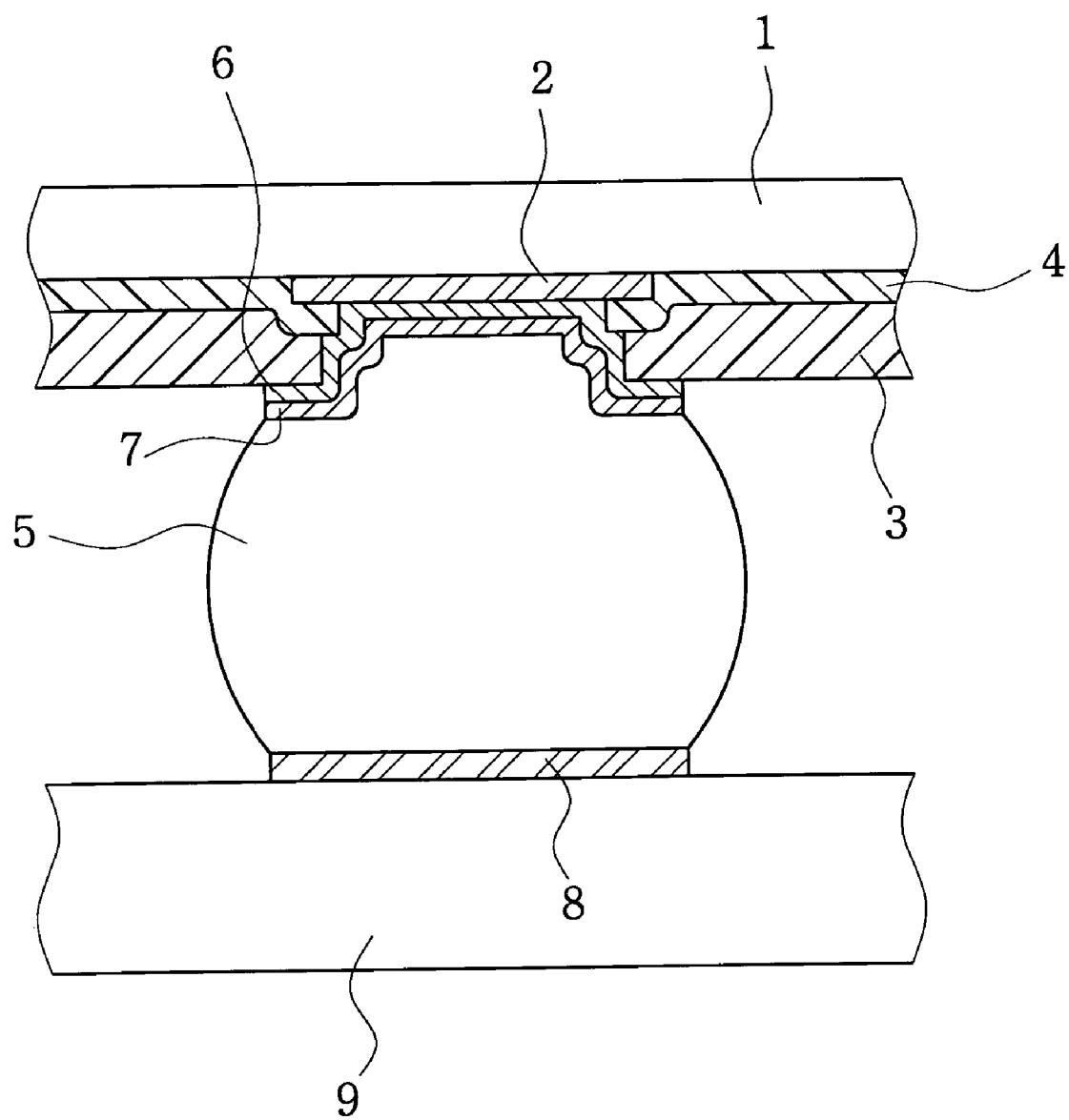
FIG. 1B is a cross-sectional view showing the prior art solder bump structure of FIG. 1A after being mounted on a circuit substrate.
Figure 2A:
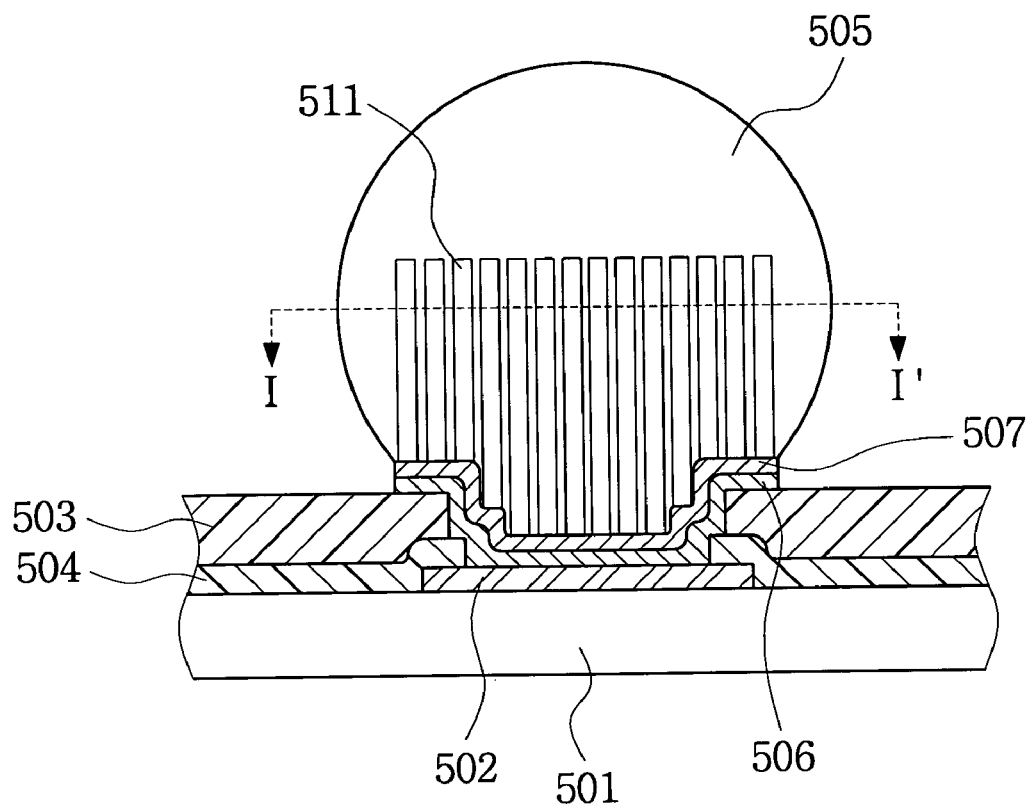
FIG. 2A is a cross-sectional view showing an example of a conventional solder bump structure.
Figure 2B:
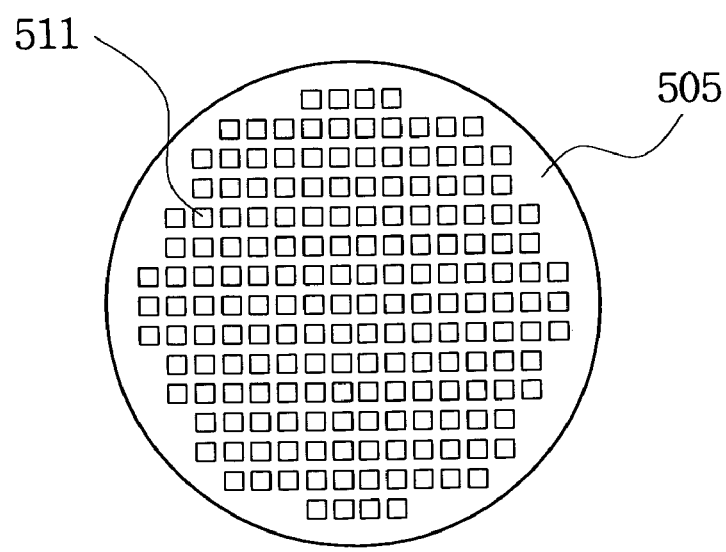
FIG. 2B is a cross-sectional view taken along the line I-I' of FIG. 2A.
Figure 3A:
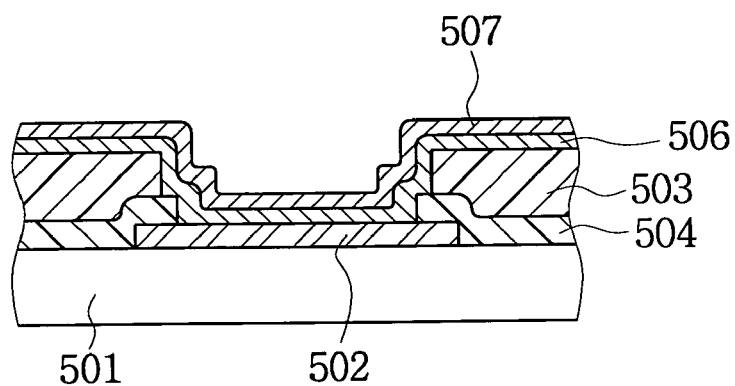
FIGS. 3A through 3I are cross-sectional views showing an example of a method for manufacturing the solder bump structure shown in FIGS. 2A and 2B.
Figure 3B:
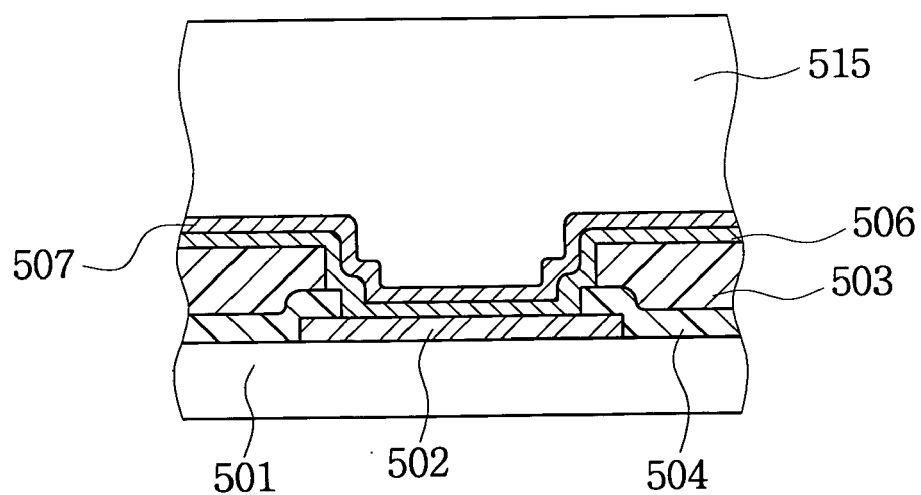
Figure 3C:
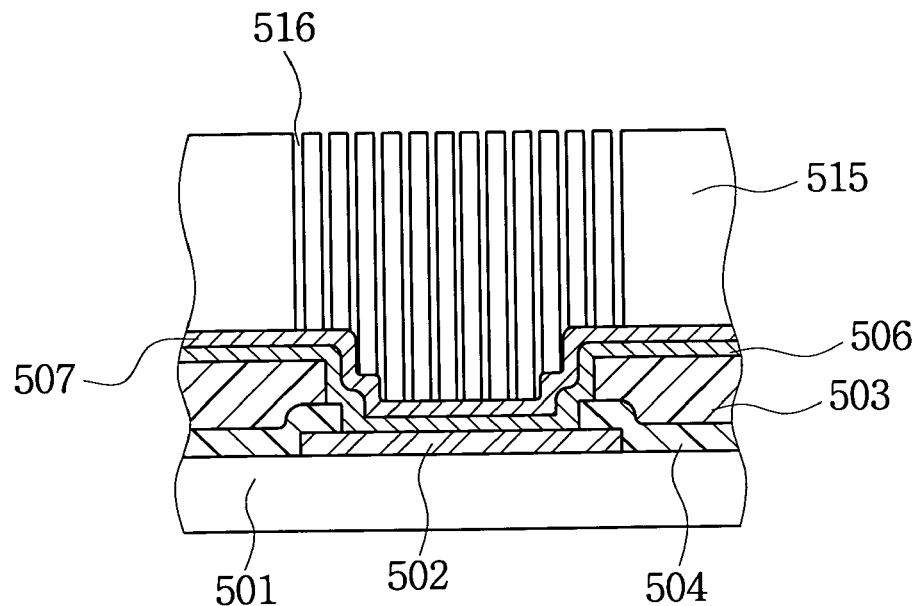
Figure 3D:
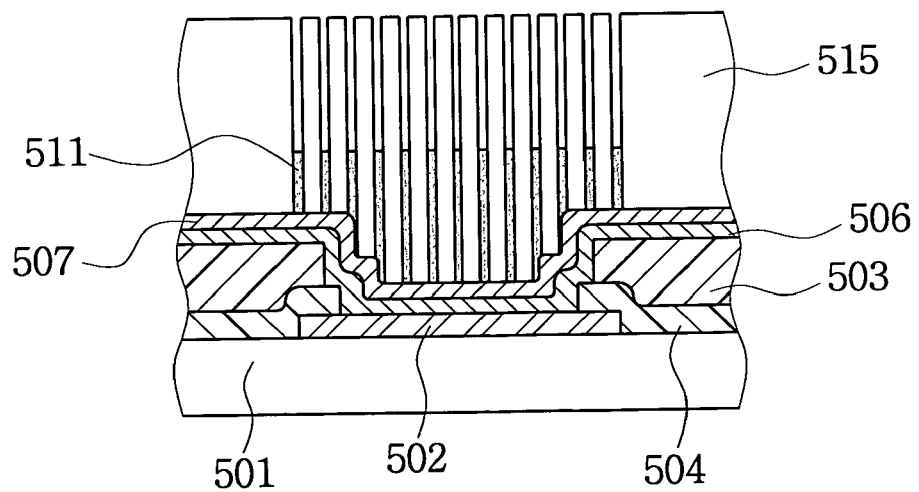
Figure 3E:
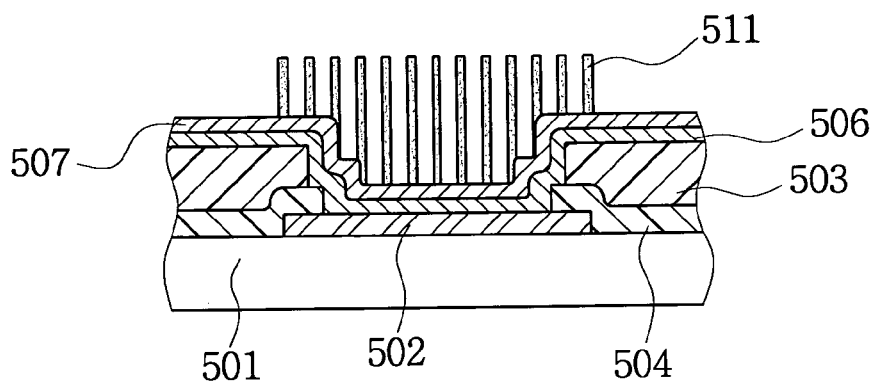
Figure 3F:
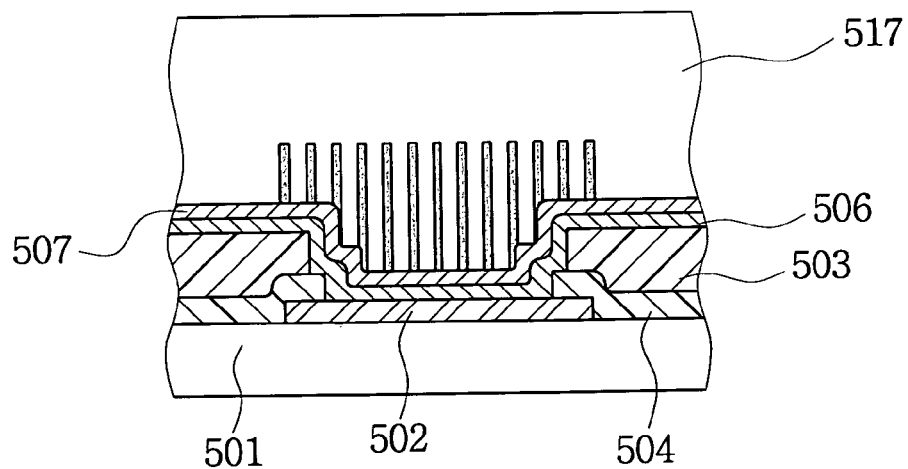
Figure 3G:
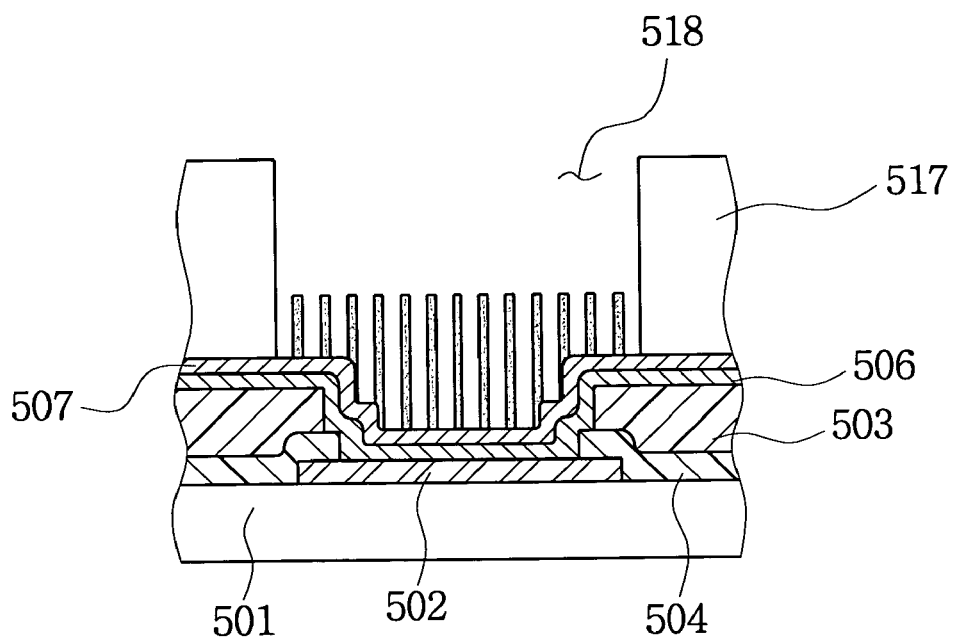
Figure 3H:
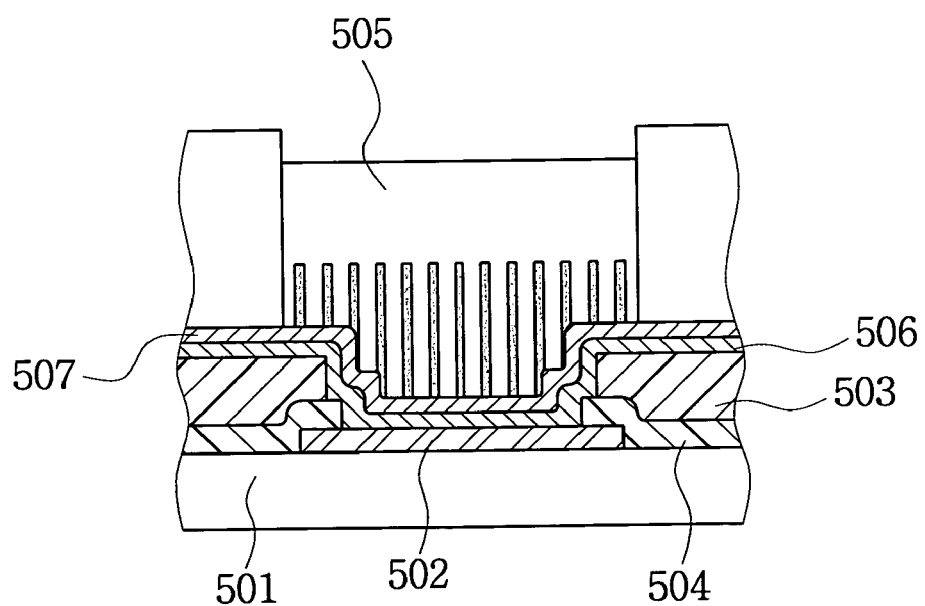
Figure 3I:
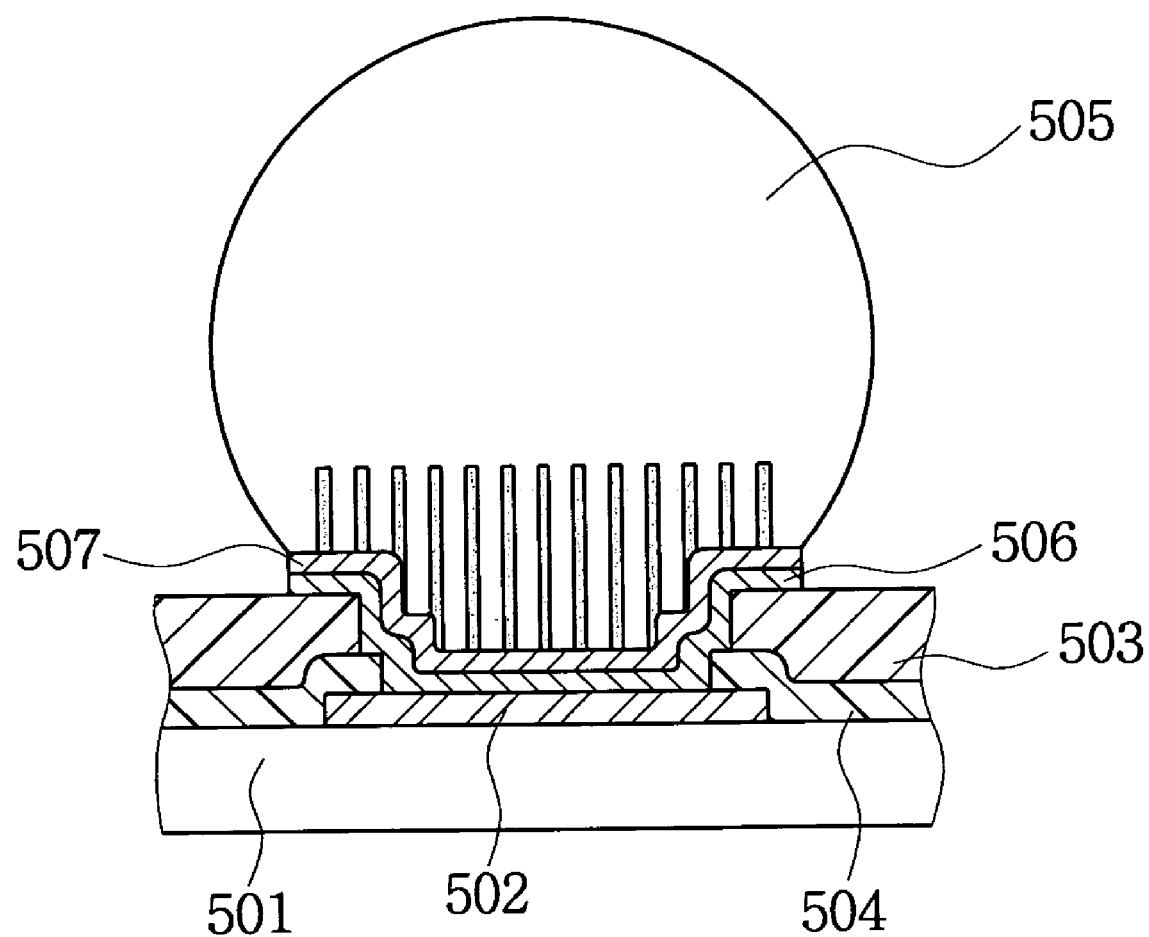
Figure 4C:
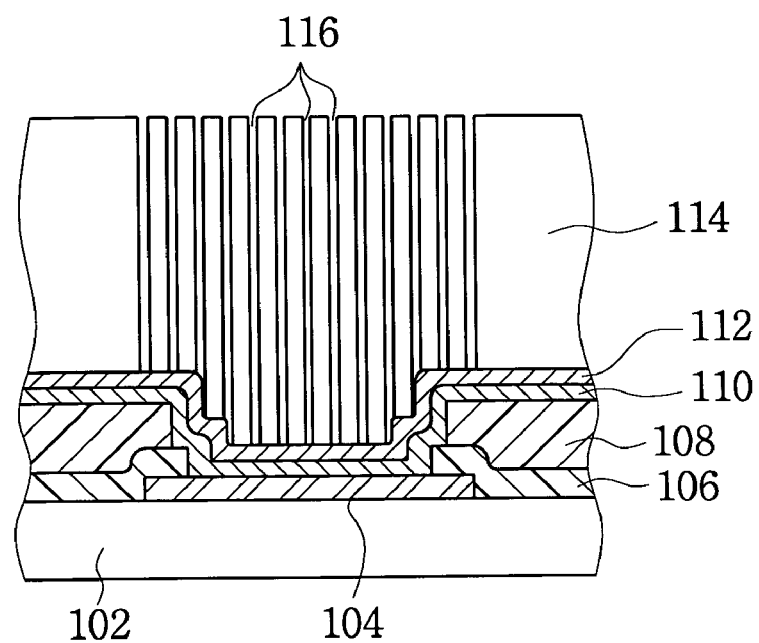

As shown in FIG. 4C, a plurality of first openings 116 may be selectively formed in the photoresist 114 by performing an exposure process and a development process on the photoresist 114. The upper UBM layer 112 may be selectively exposed through the first openings 116 in the photoresist 114. Here, the pattern and shape of the first openings 116 may determine the pattern and shape of the metal projections to be formed. It will be appreciated that the first openings 116 may be formed to have a variety of patterns and shapes. Thus, the metal projections may also be provided to have a variety of patterns and shapes. For example, the metal projections may be provided in a regular mesh pattern (e.g., as shown in FIG. 2B), or some other pattern that may depend on the pattern of the first openings 116. It will also be appreciated that the invention is not limited to a particular number of first openings 116. For example, a single first opening 116 may be provided in the photoresist 114.

Figure 4D:
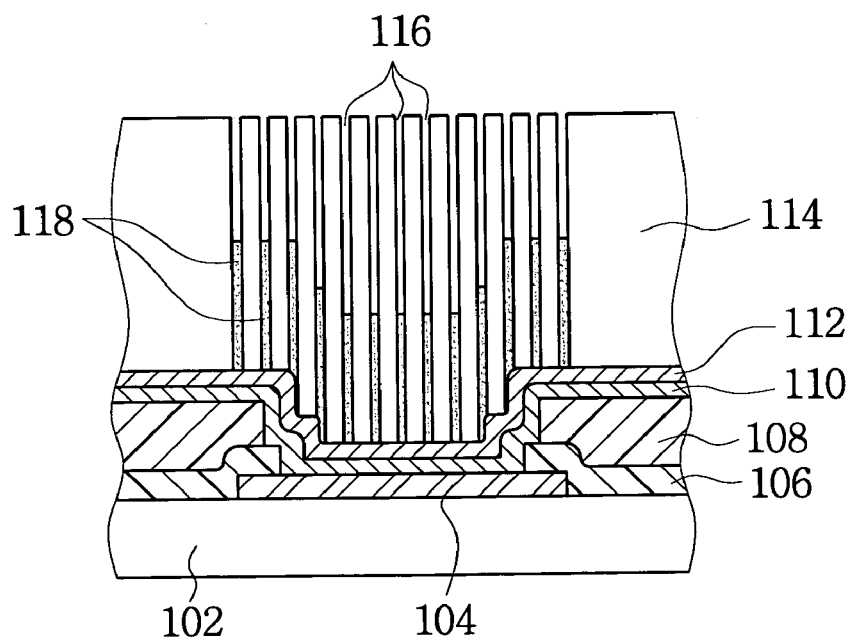

As shown in FIG. 4D, the metal projections 118 may be formed in the first openings 116 by partially filling the first openings 116 with a metal to a given height. The metal projections 118 may extend from the upper UBM layer 112. The material constituting the metal projections 118 may be Ni, Cu, Pd, Pt, alloys thereof, and/or other suitable materials, as is well known in this art. Electroplating may be used for the deposition of the metal projections 11 8. However, the invention is not so limited and the metal projections 11 8 may be provided via other methods that are well known in this art. Further, it will be appreciated that the metal projections 118 may have uniform heights or varied heights.

Figure 4E:
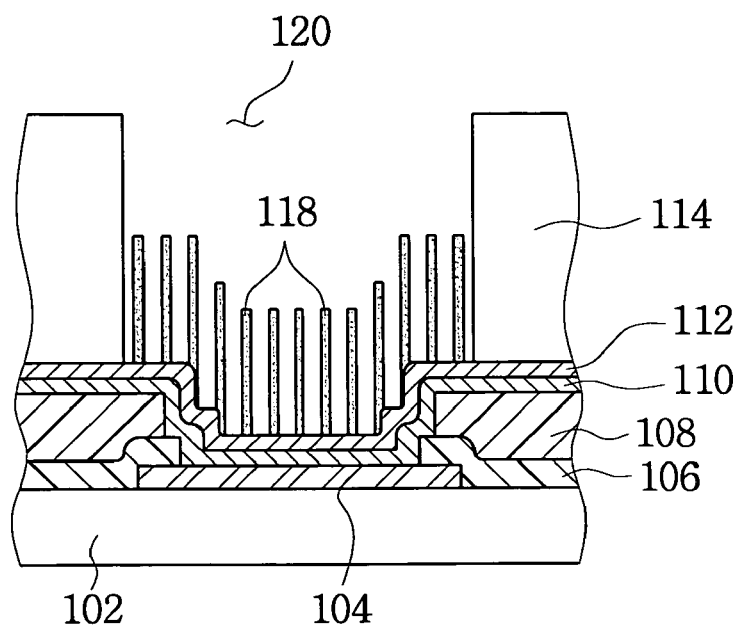

As shown in FIG. 4E, a second opening 120 may be formed in the photoresist 114 by performing an exposure process and a development process. The second opening 120 may be of a size that is large enough to expose all of the metal projections 118. The second opening 120 may define a solder bump region.

Figure 4F:
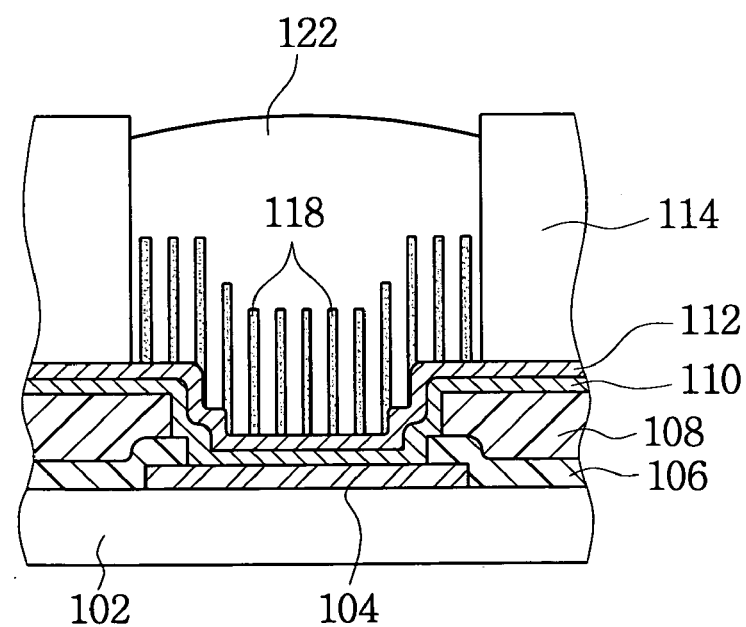

As shown in FIG. 4F, a solder material 122 may be deposited in the second opening 120. The solder material 122 may be Sn, Pb, Ni, Au, Ag, Cu, Bi, alloys thereof, and/or other suitable materials, as is well known in this art. In this exemplary embodiment, the solder material 122 may be provided in an amount sufficient to cover the metal projections 118, without overfilling the second opening 120. This is at least partially attributable to the photoresist 114 being thickly coated and the metal projections 118 only extending partially through the thickness of the photoresist 114. It will be appreciated that the size of the second opening 120 may be altered as desired, and this may be accomplished independent of the first openings 116. Thus, the second opening 120 may contain a sufficient amount of the solder material 122 so that the resultant solder bump may meet size requirements. In this way, the likelihood of over-deposition of the solder material 122 in a mushroom shape may be reduced, and a fine-pitch configuration may be realized.

Figure 4G:
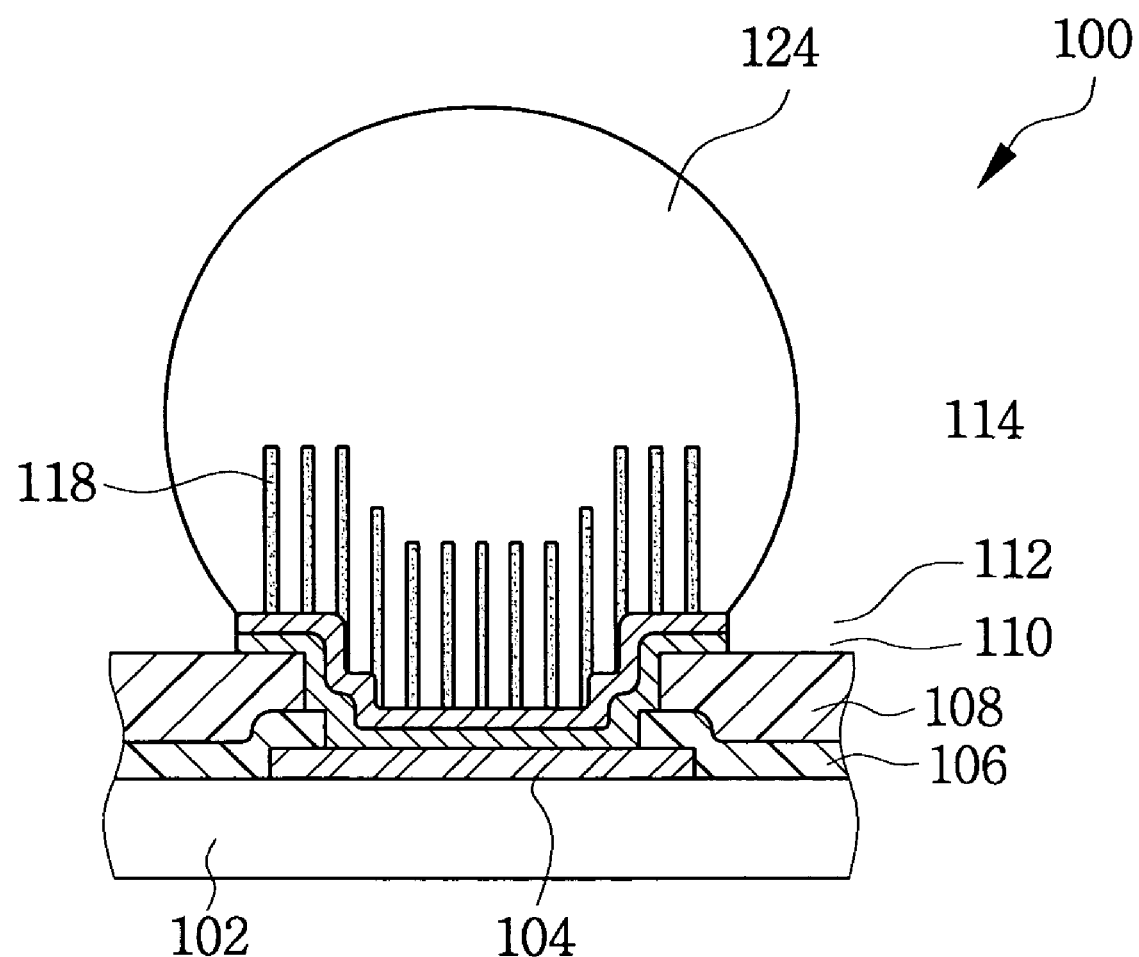

The photoresist 114 may be removed. Further, the UBM layers 110 and 112 may be etched using the solder material 122 as a mask so as to remove the portions of the UBM layers surrounding the solder bump region. As shown in FIG. 4G, a globe-shaped solder bump 124 may be formed by reflowing the solder material 122. The solder reflow techniques is well known in this art and therefore a detailed description of the same is omitted. In the finished structure 100, the metal projections 118 may be embedded within the solder bump 124.

It will be appreciated that the exemplary embodiments of the invention are not limited to any particular pattern or shape of the metal projections 118. For example, the pattern of the metal projections 118, in cross-section, may be a regular mesh pattern, an irregular mesh pattern, offset parallel row patterns, concentric sets of patterns, and any other regular or irregular patterns. Further, the individual projections 118 may have, for example, square cross-sections, elliptical cross-sections, polygonal cross-section, and combinations thereof. In addition, a single contiguous projection may be provided, for example in the shape of a spiral or zigzag pattern. Moreover, the projections 118 may have, for example, vertical sidewalls, oblique sidewalls, and notched sidewalls. Those skilled in the art will appreciate that varied and numerous other patterns and shapes of metal projections 118 may be implemented.

As discussed above, in the exemplary embodiment, the method for forming the solder bump structure 100 involves a dual exposure of a positive photoresist 114. This dual exposure technique may simplify the conventional manufacture processes. For example, the same photoresist 114 may be provided with the first opening 116 (to form the metal projections, see e.g. FIGS. 4C and 4D) and also provided with the second opening 120 (to form the solder bump, see e.g., FIGS. 4E and 4F). In this way, the exemplary method may advantageously avoid the following two steps associated with conventional wisdom: (1) a step of removing a photoresist after forming the first opening; and (2) a step of coating a second photoresist.

Figure 5A:
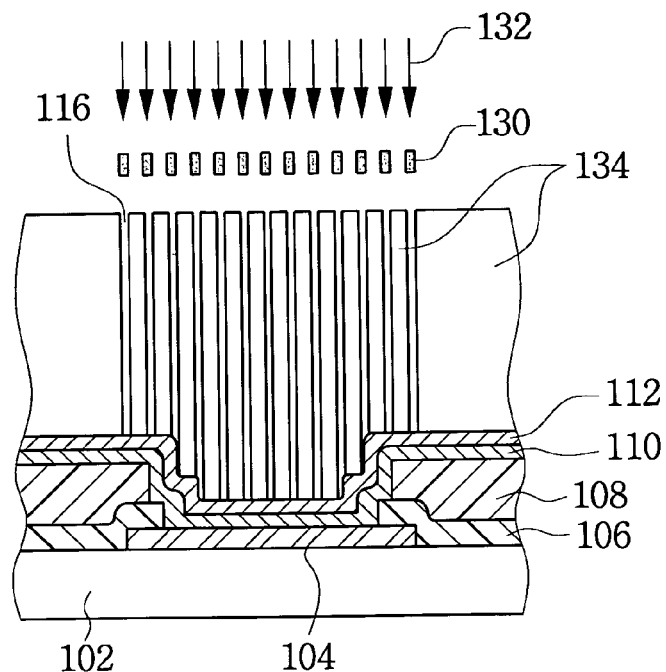
FIGS. 5A and 5B are cross-sectional views of a dual exposure process of a positive photoresist in accordance with an exemplary, non-limiting embodiment of the present invention.
Figure 5B:
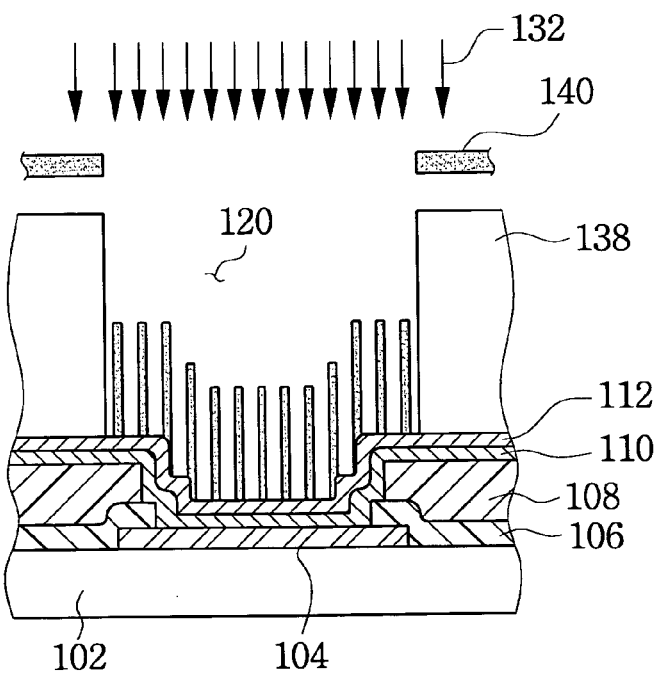

In the exemplary embodiment, the dual exposure process is carried out using a positive photoresist. A positive photoresist is one in which the exposed portions of the resist may be removed via a development process, as is well known in this art. As seen from FIG. 5A, a mask 136 may be used to expose regions of the positive photoresist to radiation 132. The exposed regions of the positive photoresist may be made soluble by a chemical reaction and the non-exposed regions 138 may remain insoluble. By removing the exposed, soluble regions in a developing solution, the first openings 116 may be created. As shown in FIG. 5B, another mask 140 may be used to expose additional regions of the positive photoresist to radiation 132. The mask 140 may be shaped to expose selected portions of the regions 138 that were not exposed using the mask 136. The second opening 120 may be created at the regions exposed via the mask 140.

While this invention has been particularly shown and described with reference to an exemplary, non-limiting embodiment thereof, it will be understood by those skilled in the art that various changes in form and details may be made therein without departing from the spirit and scope of the invention as defined by the appended claims.

What is claimed is:

1. A method for forming a solder bump structure, comprising:

forming at least one first opening in a photoresist by performing a first exposure process and a first development process;

forming a metal layer in the first opening;

forming at least one second opening in the photoresist by performing a second exposure process and a second development process; and forming a solder layer in the second opening.

2. The method of claim 1, wherein the first opening is formed at an exposed region of the photoresist, the exposed region being defined by the first exposure process.

3. The method of claim 2, wherein the second opening is formed at an exposed region of the photoresist, the exposed region being defined by the second exposure process, and the exposed region including a non-exposed region defined by the first exposure process.

4. The method of claim 1, wherein the second opening is larger than the first opening.

5. The method of claim 1, wherein the photoresist is a positive type photoresist.

6. A method for forming a solder bump structure, comprising:

forming at least one UBM layer on an active surface of an IC chip;

coating the UBM layer with a photoresist;

forming a plurality of first openings in the photoresist by performing a first exposure process and a first development process;

forming a plurality of metal layers in the plurality of first openings;

forming at least one second opening in the photoresist by performing a second exposure process and a second development process;

forming a solder layer in the second opening so that the metal layers are embedded within the solder layer;

removing the photoresist; and reflowing the solder layer.

7. The method of claim 6, wherein the photoresist is a positive type photoresist.

8. The method of claim 7, wherein the plurality of first openings are respectively formed at first exposed regions of the positive photoresist, the first exposed regions being defined by the first exposure process.

9. The method of claim 8, wherein the second opening is formed at a second exposed region of the positive photoresist, the second exposed region being defined by the second exposure process, and the second exposed region including non-exposed regions defined by the first exposure process.

10. The method of claim 6, wherein the plurality of metal layers have a pattern, in cross-section, selected from at least one of a regular mesh pattern, an irregular mesh pattern, offset parallel row patterns, and concentric sets of patterns.

11. The method of claim 6, wherein the metal layers are fabricated from at least one of Ni, Cu, Pd, Pt, and alloys thereof.

12. The method of claim 6, wherein the solder layer is fabricated from at least one of Sn, Pb, Ni, Au, Ag, Cu, Bi, and alloys thereof.

13. The method of claim 6, wherein the UBM layer includes a lower UBM layer acting as an adhesion layer and an upper UBM layer acting as a solder wetting layer.

14. The method of claim 6, wherein reflowing the solder layer forms a globe-shaped solder bump.

15. The method of claim 6, wherein the plurality of metal layers are formed so as to extend from the UBM layer.

16. A method for forming a solder bump structure, comprising:

repeatedly exposing and developing a single photoresist to sequentially provide at least two openings in the single photoresist to form only one solder layer and a metal layer embedded in the solder layer.

17. The method of claim 16, comprising:

forming the solder layer after forming the metal layer.

18. The method of claim 16, comprising:

providing a first opening in the photoresist to form the metal layer; and providing a second opening in the photoresist to form the solder layer.

19. The method of claim 18, wherein the photoresist is a positive photoresist.

20. The method of 18, comprising:

exposing and developing a first portion of the photoresist to provide the first opening; and exposing and developing a second portion of the photoresist to provide the second opening.

* * * * *